US006958174B1

(12) United States Patent
Klaus et al.

(10) Patent No.: US 6,958,174 B1
(45) Date of Patent: Oct. 25, 2005

(54) SOLID MATERIAL COMPRISING A THIN METAL FILM ON ITS SURFACE AND METHODS FOR PRODUCING THE SAME

(75) Inventors: Jason W. Klaus, Portland, OR (US); Steven M. George, Portland, CO (US)

(73) Assignee: Regents of the University of Colorado, Boulder, CO (US)

( * ) Notice: Subject to any disclaimer, the term of this patent is extended or adjusted under 35 U.S.C. 154(b) by 0 days.

(21) Appl. No.: 09/523,491

(22) Filed: Mar. 10, 2000

Related U.S. Application Data

(60) Provisional application No. 60/124,532, filed on Mar. 15, 1999.

(51) Int. Cl.[7] ........................ C23C 16/00; C23C 14/00; C23C 14/07

(52) U.S. Cl. ................. 427/250; 427/253; 427/255.26; 427/255.27

(58) Field of Search ............................... 427/250, 251, 427/252, 253, 255.26, 255.27

(56) References Cited

U.S. PATENT DOCUMENTS

| | | | | | |
|---|---|---|---|---|---|
| 5,175,017 | A | * | 12/1992 | Kobayashi et al. | 427/8 |
| 5,306,666 | A | * | 4/1994 | Izumi | 437/192 |
| 5,681,775 | A | * | 10/1997 | Pogge | 437/62 |
| 5,916,365 | A | * | 6/1999 | Sherman | 117/92 |
| 6,040,010 | A | * | 3/2000 | Srinivasan et al. | 427/250 |
| 6,066,366 | A | * | 5/2000 | Berenbaum et al. | 427/250 |
| 6,143,659 | A | * | 11/2000 | Leem | 438/688 |
| 6,174,809 | B1 | * | 1/2001 | Kang et al. | 438/682 |
| 6,200,893 | B1 | * | 3/2001 | Sneh | 438/685 |
| 6,440,541 | B1 | * | 8/2002 | Humphrey et al. | 428/209 |
| 6,475,276 | B1 | * | 11/2002 | Elers et al. | 117/84 |

OTHER PUBLICATIONS

Bean, Heather; Deposition and Thin Film Properties of CVD Tungsten Films Using SiH4, H2, and Si Reduction of WF6, www.frii.com/~bean/properties.htm, Nov. 6, 1998.*

Tsai et al., Layer Tungsten and its Applications for VLSI Interconnects, International Electron Devices Meeting Technical Digest, Dec. 11-14, 1988.*

Kumagai et al., Fabrication of Titanium Oxide Thin Films . . . , 1995, Thin Solid Films 263, pp. 47-53.

Ritala et al., Studies on the Morphology of $Al_2O_3$ Thin Films . . . , 1996, Thin Solid Films 286, pp. 54-58.

Ritala et al., Growth of Titanium Dioxide Thin Films . . . , 1993, Thin Solid Films 225, pp. 288-295.

Han et al., A Near-Edge X-Ray Absorption Fine Structure Study of Atomic Layer Epitaxy . . . , 1998, Surface Science 415, pp. 251-263.

Morishita et al., Atomic-Layer Chemical-Vapor-Deposition of Silicon-Nitrate, 1997, Applied Surface Science 112, pp. 198-204.

Takahashi et al., Germanium Atomic Layer Epitaxy Controlled by Surface Chemical Reactions, Jun. 1989, Journal of Electrochem, Soc.-vol. 136-No. 6, pp. 1826-1827.

(Continued)

*Primary Examiner*—Timothy Meeks
*Assistant Examiner*—Eric B Fuller
(74) *Attorney, Agent, or Firm*—Gary C Cohn PLLC

(57) ABSTRACT

The present invention provides a solid material comprising a solid substrate having a thin metal film and methods for producing the same. The method generally involves using a plurality self-limiting reactions to control the thickness of the metal film.

14 Claims, 12 Drawing Sheets

OTHER PUBLICATIONS

Gates et al., Epitalxial Si Films on Ge(100) Grown via H/CI Exchange, Feb. 1993, Applied Phys. Lett. 62 (5), pp. 510-512.

Ishii et al., Atomic Layer Epitaxy of AIP SNF its Application to . . . , 1997, Journal of Crystal Growth 180, pp. 15-21.

Juppo et al., Deposition of Copper Films by an Alternate Supply of CuCl and Zn, 1997, Journal of Vac. Sci. Technol. A 15(4), pp. 2330-2333.

Bell et al., Batch Reactor Kinetic Studies of Tungsten LPCVD . . . , Jan. 1996, Journal of Electrochem. Soc.-vol. 143-No. 1, pp. 296-302.

Martensson et al., Atomic Layer Epitaxy of Copper on Tantalum, 1997, Chem. Vap. Deposition-3-No. 1, pp. 1-6.

Kumagai et al., Titanium Oxide/Aluminum Oxide Multilayer Reflectors . . . , May 1997, Applied Phys. Lett. 70 (18), pp. 2338-2340.

Kobayashi et al., Is Situ Infrared Reflection and Transmission Absorbsion . . . , May 1993, Journal of Appl. Phys. 73 (9), pp. 4637-4643.

Kobayashi et al., Study on Mechanism of Selective Chemical Vapor Deposition . . . , Jan. 1991, Journal of appl. Phys. 69 (2), pp. 1013-1019.

Klaus et al., Atomic Layer Controlled Growth of $SiO_2$ Films . . . , Mar. 1997, Applied Phys. Lett. 70 (9), pp. 1092-1094.

Klaus et al., $Al_3O_3$ Thin Film Growth on Si(100) Using Binary Reaction Sequence Chemistry, 1997, Thin Solid Films 292, pp. 135-144.

George et al., Surface Chemistry for Atomic Layer Growth, 1996, Journal of Phys. Chem 100, pp. 13121-13131.

Klaus et al., Atomic Layer Controlled Growth of $Si_3N_4$ Films . . . , Surface Science 418, pp. L14-L19.

* cited by examiner

SOLID MATERIAL COMPRISING A THIN METAL FILM ON ITS SURFACE AND METHODS FOR PRODUCING THE SAME

CROSS-REFERENCE TO RELATED APPLICATIONS

This application claims the benefit of U.S. Provisional Application No. 60/124,532, filed Mar. 15, 1999.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. DAAG55-98-C-0036 awarded by DARPA, in conjunction with the U.S. Army Research Office and by the terms of a Grant No. F49620-99-1-0081 by Air Force Office of Scientific Research.

BACKGROUND OF THE INVENTION

The atomic layer controlled growth or atomic layer deposition (ALD) of single-element films is important for thin film device fabrication [1]. As component sizes shrink to nanometer dimensions, ultrathin metal films are necessary as diffusion barriers to prevent interlayer and dopant diffusion [2]. Conformal metal films are needed as conductors on high aspect ratio interconnect vias and memory trench capacitors [3]. The ALD of single-element semiconductor films may also facilitate the fabrication of quantum confinement photonic devices [4].

Currently, most thin metal films are formed by a chemical vapor deposition (CVD) method. However, the CVD process often results in pin-holes, gaps and/or defects on the surface. Furthermore, the resulting thin metal film surface is often rough and has uneven metal film thickness.

While thin films of a variety of binary materials can be grown with atomic layer control using sequential self-limiting surface reactions [5,6], thin film of metal using ALD has not been successful achieved. For example, ALD technique has recently been employed to deposit a variety of binary materials including oxides [7-11], nitrides [12,13], sulfides [14,15] and phosphides [16]. In contrast, the atomic layer growth of single-element, e.g., metal, films has never been achieved using this approach. Earlier efforts to deposit copper with atomic layer control were unsuccessful because the surface chemistry was not self-limiting and the resulting copper films displayed coarse polycrystalline grains [17,18]. Previous attempts to achieve silicon ALD with sequential surface chemistry could not find a set of reactions that were both self-limiting [19]. Germanium ALD has been accomplished using self-limiting surface reactions only in conjunction with a temperature transient [20].

Therefore, there is a need for a method for forming a thin metal film layer on a solid material surface using a plurality of self-limiting reactions.

SUMMARY OF THE INVENTION

One embodiment of the present invention provides a method for forming a thin metal film layer on a solid substrate surface to produce a solid material having a thin metal film layer, wherein said method comprises:

(a) selecting a chemical reaction which requires at least two different reagents to produce the metal, wherein the reaction can be divided into a plurality of separate self-limiting reactions; and (b) sequentially conducting the plurality of separate self-limiting reactions to produce the thin metal film layer on the solid substrate surface.

Preferably, the solid substrate surface comprises a functional group which optionally can be activated to undergo the chemical reaction. For example, the solid substrate comprises a group selected from oxides, nitrides, metals, semiconductors, polymers with a functional group (e.g., a non-hydrocarbon moiety), and mixtures thereof. In one particular embodiment of the present invention, the solid substrate comprises hydroxides on its surface which serves as a site of further reaction to allow formation of a thin metal film. Such hydroxides can be generated, for example, by water plasma treatment of a solid substrate surface. Preferably, the solid substrate comprises a conducting, insulating or a semiconductor material.

In one particular embodiment of the present invention, the plurality of self-limiting reactions comprises a binary reaction. Preferably, the reagents used in the reactions are non-transient species, i.e., they can be isolated and stored. Preferably, the plurality of reactions involves using a reactant in a gaseous (e.g., vapor) state. Such reactant may be a liquid or preferably a solid having a relatively high vapor pressure. For a reactant which is non-gaseous material at ambient pressure and temperature, the vapor pressure of the reactant at 100° C. is at least about 0.1 torr, preferably at least about 1 torr, and more preferably at least about 100 torr.

Preferably, the plurality of self-limiting reactions use a metal halide and a metal halide reducing agent. Exemplary metal halides include halides of transition metals and halides of semiconductors. Preferred halide is fluoride. Exemplary transition metals and semiconductors which are useful in the present invention include tungsten, rhenium, molybdenum, antimony, selenium, thallium, chromium, platinum, ruthenium, iridium, and germanium. Preferred metal halide is halide of tungsten, more preferably tungsten hexafluoride. Exemplary metal halide reducing agents which are useful in the present invention include silylating agents, such as silane, disilane, trisilane, and mixtures thereof. Preferably, a metal halide reducing agent is selected from the group consisting of silane, disilane, trisilane, and mixtures thereof. More preferably, a metal halide reducing agent is disilane.

In one particular embodiment, a method for producing a thin film of metal on a surface of a solid substrate comprises:

(a) contacting the solid substrate surface with a metal halide under conditions sufficient to produce a metal halide surface;

(b) contacting the metal halide surface with a silylating agent under conditions sufficient to produce a metal-silicon surface; and (c) contacting the metal-silicon surface with metal halide under conditions sufficient to produce the thin metal film surface.

The solid substrate surface can be contacted with a silylating agent prior to contacting with the metal halide to produce a surface having a silane group. This is particularly useful for solid substrate which comprises a hydroxide group, for example, silicon semiconductors having silicon dioxide ($SiO_2$) top layer can be treated with appropriate chemicals and/or conditions to produce hydroxylated silicon surface which can then be contacted with silylating agent to produce a surface containing silane moieties.

By repeating the plurality of self-limiting reactions, thin metal film layer of various thickness can be achieved. Moreover, each complete cycle of the plurality of self-limiting reactions provides a metal film thickness which substantially corresponds to the atomic spacing of such metal. For example, the thickness of a tungsten monolayer is about 2.51 Å, and each complete cycle of the plurality of self-limiting reactions of the present invention which provides tungsten film results in a tungsten monolayer film of about 2.48 Å to about 2.52 Å. Thus, the total thickness of the metal film is directly proportional to the number of complete cycles of the plurality of self-limiting reactions.

A solid material produced by the present methods comprises a thin metal film layer, wherein the ratio of roughness of the solid substrate surface to roughness of the solid material surface with the thin metal film layer is from about 0.8 to about 1.2, preferably from about 0.9 to about 1.2, and more preferably from about 1 to about 1.2.

The roughness of a flat portion of the solid material is about 50% or less of roughness of a substantially same solid material produced by a chemical vapor deposition process or 50% or less of roughness of a substantially same solid material in a ballistic deposition model, preferably the roughness is about 40% or less, and more preferably about 30% or less. This percentage is expected to decrease as the thickness increases. The roughness of solid material produced by the present method should be substantially constant independent of the film thickness. In contrast, the roughness of the solid material produced by the CVD will generally depend on the square root of the thickness.

As stated above, while a variety of metal film thickness can be achieved by the methods of the present invention, a solid material having a tungsten film layer thickness of about 100 Å or less, preferably 50 Å or less, are particularly useful in a variety of electronic application. For a solid material having a tungsten film, the thickness of the tungsten film layer is substantially equal to 2.5 Å×n, where n is an integer and represents the number of complete cycles of the plurality of self-limiting reactions.

DETAILED DESCRIPTION OF THE INVENTION

Figure 1:
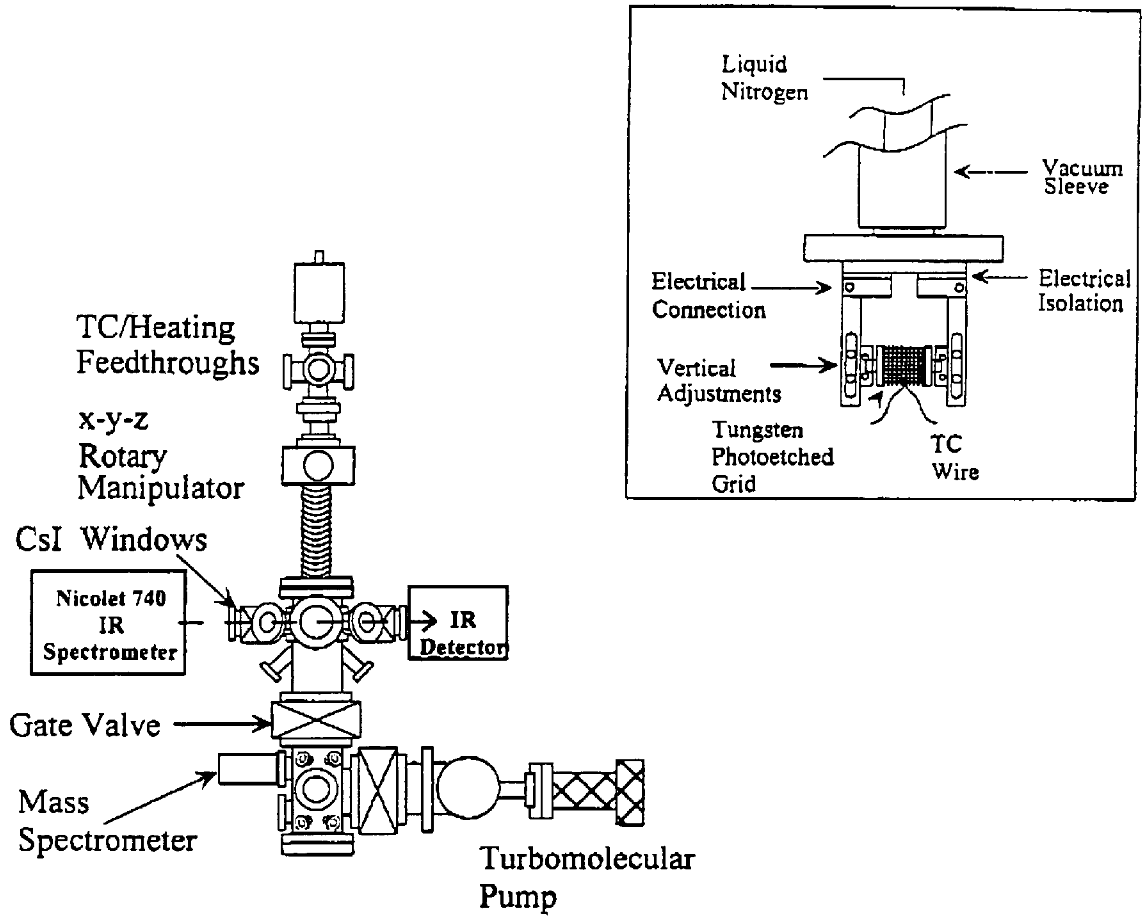
FIG. 1 is an experimental schematic of vacuum chamber for transmission Fourier transform infrared (FTIR) studies on high surface area samples. Inset shows the sample holder. $SiO_2$ particles are pressed into a tungsten grid and positioned in the infrared beam.

The present invention provides a novel method for producing a solid material comprising a solid substrate which has a thin metal film layer on its surface. The present invention is based on self-terminating surface reactions to achieve atomic layer control of thin metal film growth. As stated above, the present invention can be used to produce a variety of metal film layers on a solid substrate that comprises a functional group on its surface. In general, methods of the present invention rely on a reaction sequence where one reactant removes surface species without being incorporated in the film. This novel method facilitates the ALD of various metal, insulator and semiconductor single-element films. Methods of the present invention are particularly useful in producing a tungsten film on a conducting, insulating or semiconductive solid material; therefore, the present invention will be described in reference to the production of a tungsten film on a solid substrate comprising silicon, for example, silicon dioxide and/or silicon hydroxide, on its surface.

Thus, one particular embodiment of the present invention provides a method for producing single-element tungsten films using sequential self-limiting surface reactions at a constant temperature. To deposit tungsten with atomic layer control, methods of the present invention separate a CVD reaction, e.g., $$WF_6(g)+Si_2H_6(g)\rightarrow W(s)+2SiHF_3\,(g)+2H_2(g)$$

into the following two self-limiting half-reactions:

$${}^*W\text{—}SiH_yF_z+WF_6(g)\rightarrow {}^*W\text{—}WF_x+SiH_aF_b(g) \quad (1)$$

$$^*WF_x+Si_2H_6(g)\rightarrow {}^*W\text{—}SiH_yF_z+2H_2(g)+SiH_aF_b(g) \quad (2)$$

where the asterisks designate the surface species. Without being bound by any theory, it is believed that there are several reaction pathways; therefore, the stoichiometry of the surface species and gas products is kept indefinite. Successive application of the $WF_6$ and $Si_2H_6$ half-reactions (Equations 1 and 2, respectively) in an ABAB . . . binary reaction sequence (e.g., Eqns 1 and 2) produces W ALD having a various tungsten thickness depending on the number of binary reaction cycles.

Tungsten is a hard, refractory, relatively inert metal that has found widespread use in making filaments and filling contact holes and vias in microelectronic circuits [21]. The chemical vapor deposition (CVD) reaction has been used previously to deposit tungsten [22]. $SiH_4$ has also been employed instead of $Si_2H_6$ [2,3,22–25]. In contrast, methods of the present invention separated this overall CVD reaction into a plurality of self-limiting reaction, specifically binary self-limiting reactions, i.e., two separate reactions each involving different chemistry.

The sequential self-limiting surface reactions and the atomic layer controlled growth of tungsten films can be monitored using a variety of techniques known to one of ordinary skill in the art. For example, vibrational spectroscopic studies can be performed on high surface area silica powders using transmission Fourier transform infrared (FTIR) investigations. Briefly, FTIR spectroscopy can be used to measure the coverage of fluorine and silicon species during the $WF_6$ and $Si_2H_6$ half-reactions. The tungsten films can be deposited on Si(100) substrates and examined using in situ spectroscopic ellipsometry. The ellipsometry measurements can be used to determine the tungsten film thickness and index of refraction versus deposition temperature and reactant exposure. Additional atomic force microscopy studies can be used to characterize the flatness of the tungsten films relative to the initial Si(100) substrate. The tungsten film properties can also be evaluated by x-ray photoelectron spectroscopy (XPS) depth-profiling to determine film stoichiometry and x-ray diffraction experiments to ascertain film structure.

Figure 4:
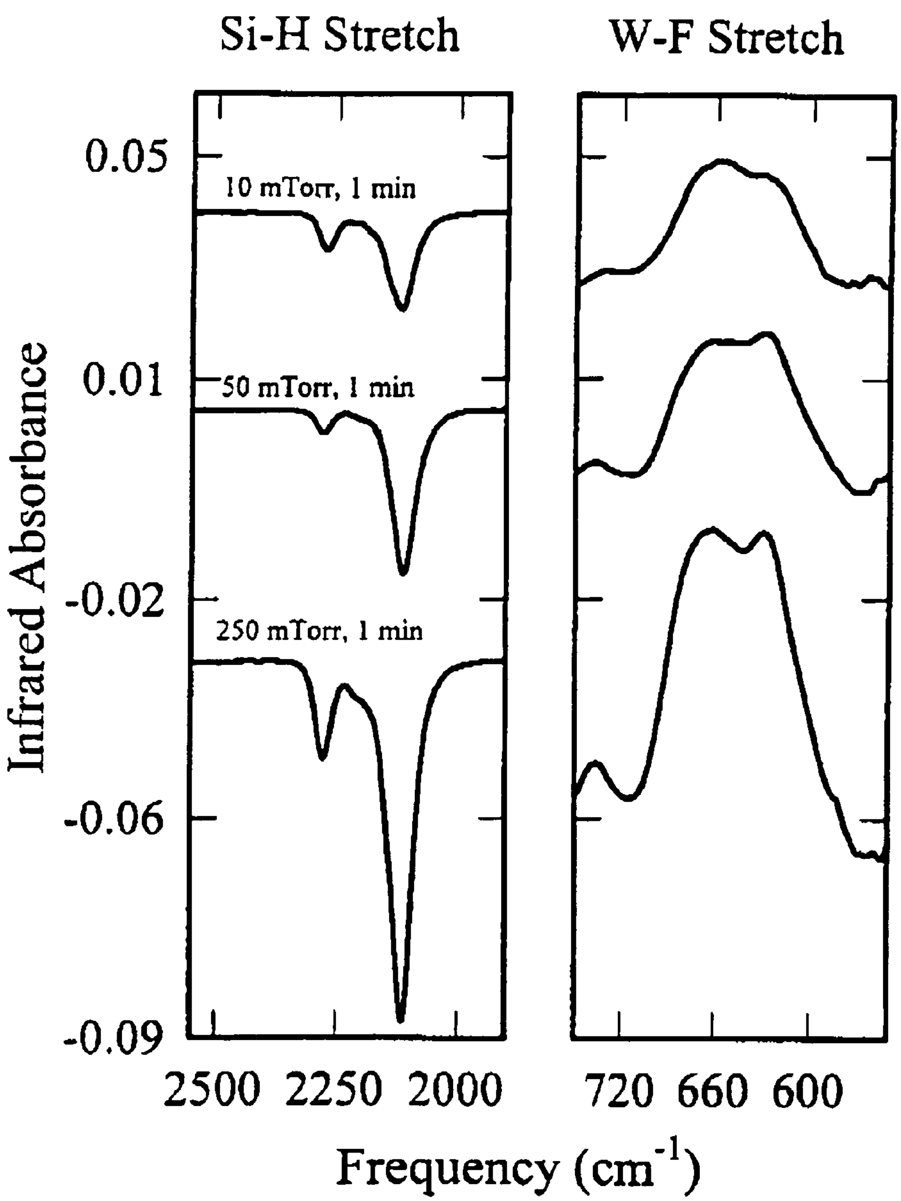
FIG. 4 is a FTIR difference spectra recorded versus $WF_6$ exposure during the $WF_6$ half-reaction at 425 K. Each spectrum is referenced to the initial surface that had received a saturation $Si_2H_6$ exposure.

Use of a sequential surface chemistry technique allows deposition of ultrathin and smooth tungsten films for thin film device fabrication. Thus, as FTIR difference spectra of FIG. 4 shows, it is believed that the $*SiH_yF_z$ species react with $WF_6$ and desorb as volatile $SiH_aF_b$ molecules as indicated in Equation 1. The FTIR difference spectra was recorded during the $WF_6$ half-reaction at 425° K. Each spectrum is referenced to the initial surface that had earlier received a saturation $Si_2H_6$ exposure. The spectra are offset from the origin for clarity in presentation. As shown in FIG. 4, the Si—H stretching region possesses two negative absorbance features located at 2115 and 2275 $cm^{-1}$. It is believed that these negative absorbance features correspond to the loss of $*SiH_x$ and $*SiH_yF_x$ species, respectively [24,25,32]. Other negative spectral features at about 950 $cm^{-1}$ and about 840 $cm^{-1}$ are believed to be due to the loss of Si—H scissors and Si—F stretching modes [24,25,32]. The $*WF_x$ species are observed in FIG. 4 in the W—F stretching region. The $*WF_x$ species appear as a single broad positive absorbance feature at 600–700 $cm^{-1}$ [24,25,32].

Figure 5:
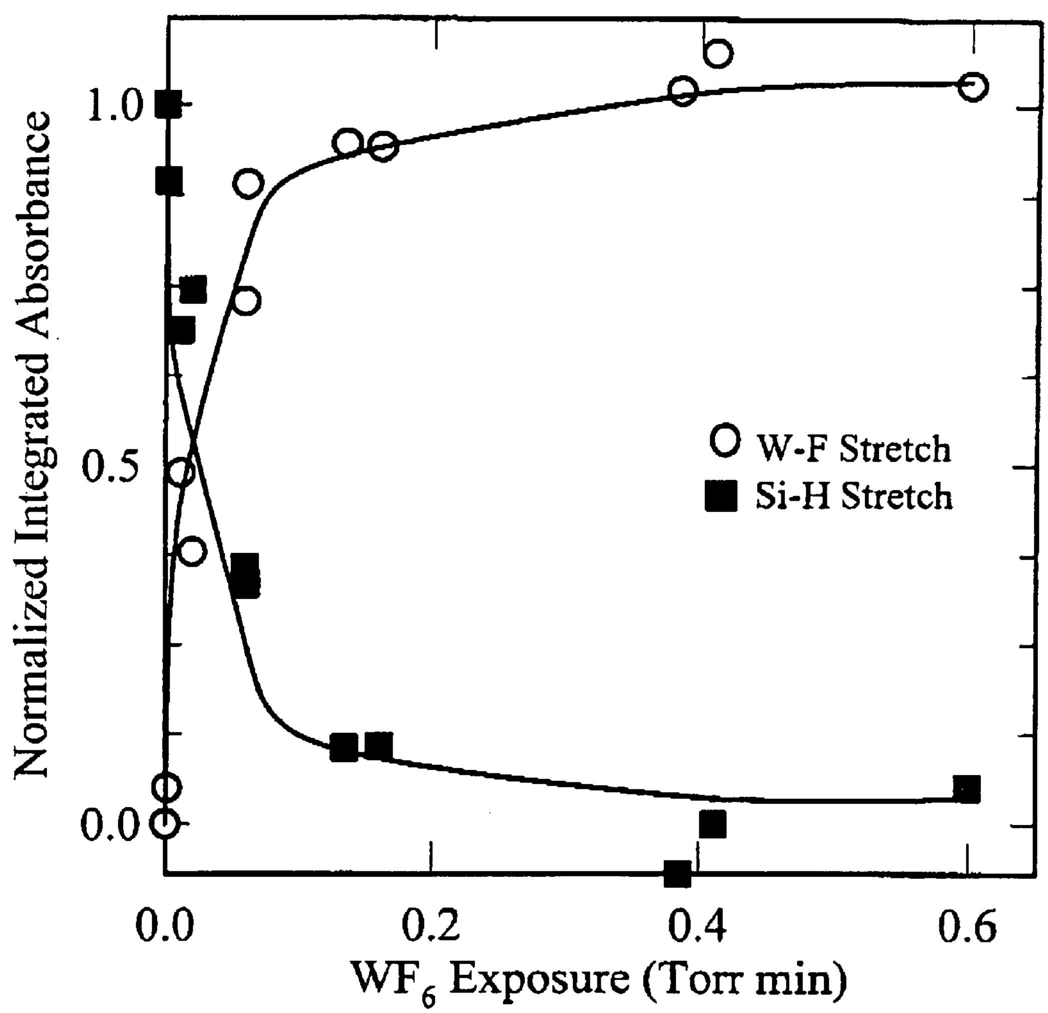
FIG. 5 shows normalized integrated absorbances of the W—F stretching vibration at ~680 $cm^{-1}$ and the Si—H stretching vibrations at 2115 and 2275 $cm^{-1}$ versus $WF_6$ exposure during the $WF_6$ half-reaction at 425 K.

As shown in FIG. 5, which is a normalized integrated FTIR absorbances during the $WF_6$ half-reaction, the growth of infrared absorbance attributed to the $*WF_x$ species is concurrent with the loss of infrared absorbance assigned to the $*SiH_yF_z$ species. This behavior is expected from the half-reaction given by Eqn. 1. This correlation shows that the $Si_2H_6$ half-reaction occurs by the exchange of surface functional groups. The $WF_6$ half-reaction proceeded to completion in about 1 min at a reactant pressure of 250 mTorr at 425° K.

Figure 6:
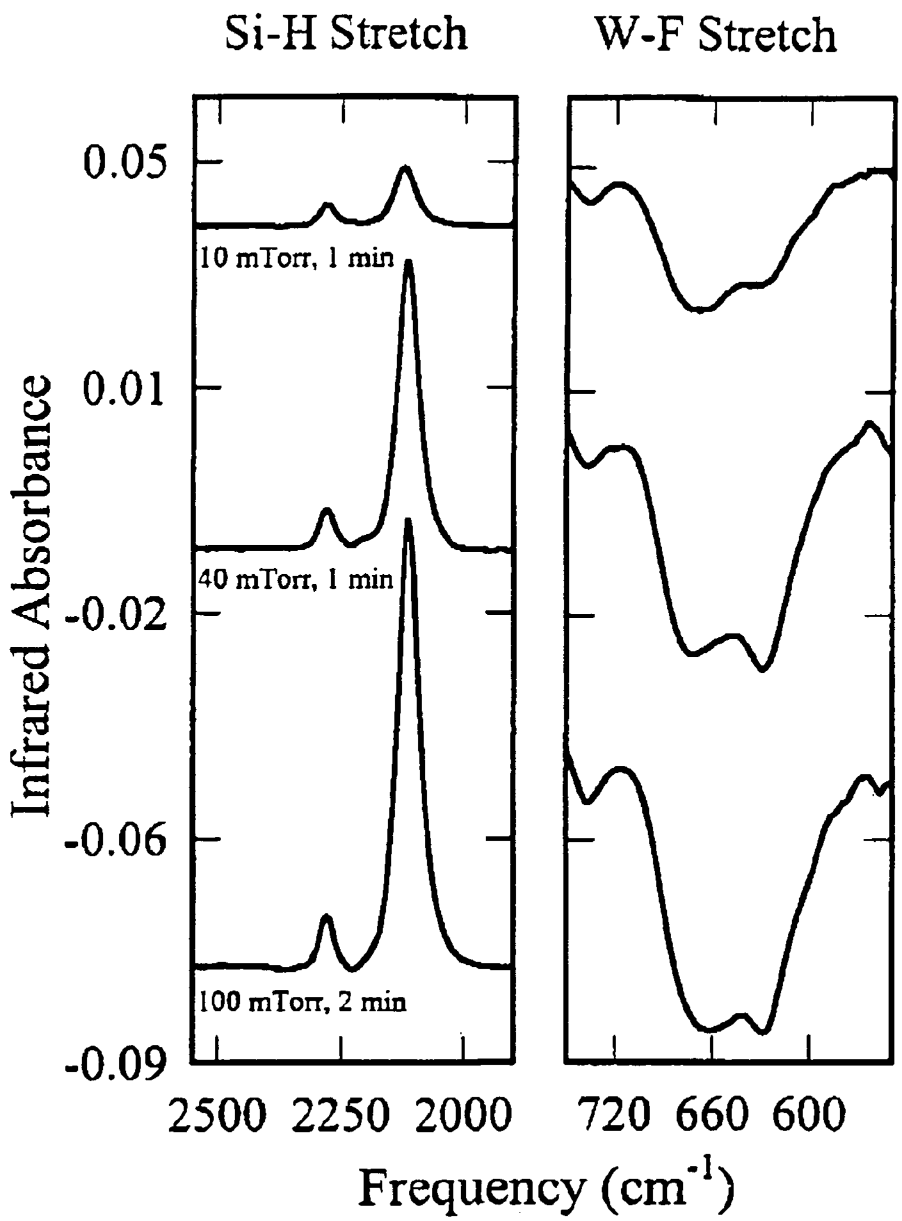
FIG. 6 is a FTIR difference spectra recorded versus $Si_2H_6$ exposure during the $Si_2H_6$ half-reaction at 425 K. Each spectrum is referenced to the initial surface that had received a saturation $WF_6$ exposure.

The surface resulting from a complete $WF_6$ half-reaction is then reacted with $Si_2H_6$. FIG. 6 shows FTIR difference spectra monitored after various $Si_2H_6$ exposures at 425° K. Each spectrum is referenced to the initial surface that had earlier received a saturation $WF_6$ exposure. The spectra are again offset from the origin for clarity in presentation. During the $S_2H_6$ half-reaction (i.e., Equation 2), the vibrational features in the Si—H and W—F stretching regions show that the $*WF_x$ species react with the $Si_2H_6$ precursor to produce $*SiH_yF_z$ species.

Figure 7:
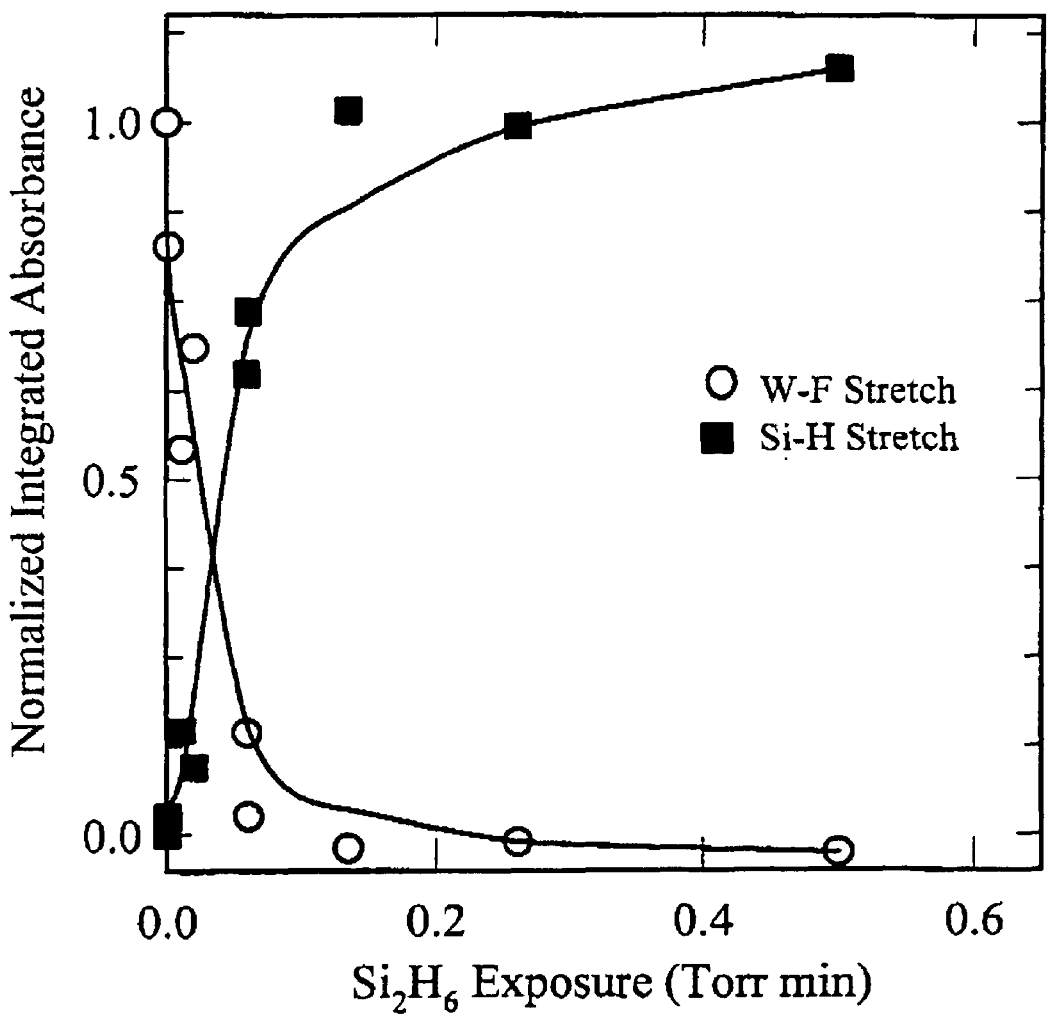
FIG. 7 is normalized integrated absorbances of the W—F stretching vibration at ~680 $cm^{-1}$ and the Si—H stretching vibrations at 2115 and 2275 $cm^{-1}$ versus $Si_2H_6$ exposure during the $Si_2H_6$ half-reaction at 425 K.

FIG. 7 shows the normalized integrated absorbances recorded during the $Si_2H_6$ reaction. As predicted by Eqn. 2, the growth of the Si—H absorbance features is coincident with the reduction of W—F absorbance features. This is believed to be indicative of the fact that the $Si_2H_6$ half-reaction occurs by the exchange of surface functional groups. The $Si_2H_6$ half-reaction proceeded to completion in about 2 mins with a reactant pressure of 100 mTorr at 425° K.

It is believed that the overall role of the $Si_2H_6$ reactant in the sequential surface chemistry is only "sacrificial", i.e., the final film does not contain the silane group from $Si_2H_6$. It is believed that the $Si_2H_6$ reduces the $*WF_x$ species, and the resulting $*SiH_yF_z$ species is lost as a volatile $SiH_aF_b$ reaction product during the next $WF_6$ half-reaction. When the $Si_2H_6$ half-reaction reaches completion, the $*SiH_yF_z$ coverage is equivalent to the $*SiH_yF_z$ coverage measured after the previous $Si_2H_6$ half-reaction. Similarly, the loss of $*SiH_yF_z$ coverage during the $WF_6$ half-reaction results in the growth of $*WF_x$ coverage that becomes equivalent to the $*WF_x$ coverage measured after the previous $WF_6$ half-reaction.

Figure 8:
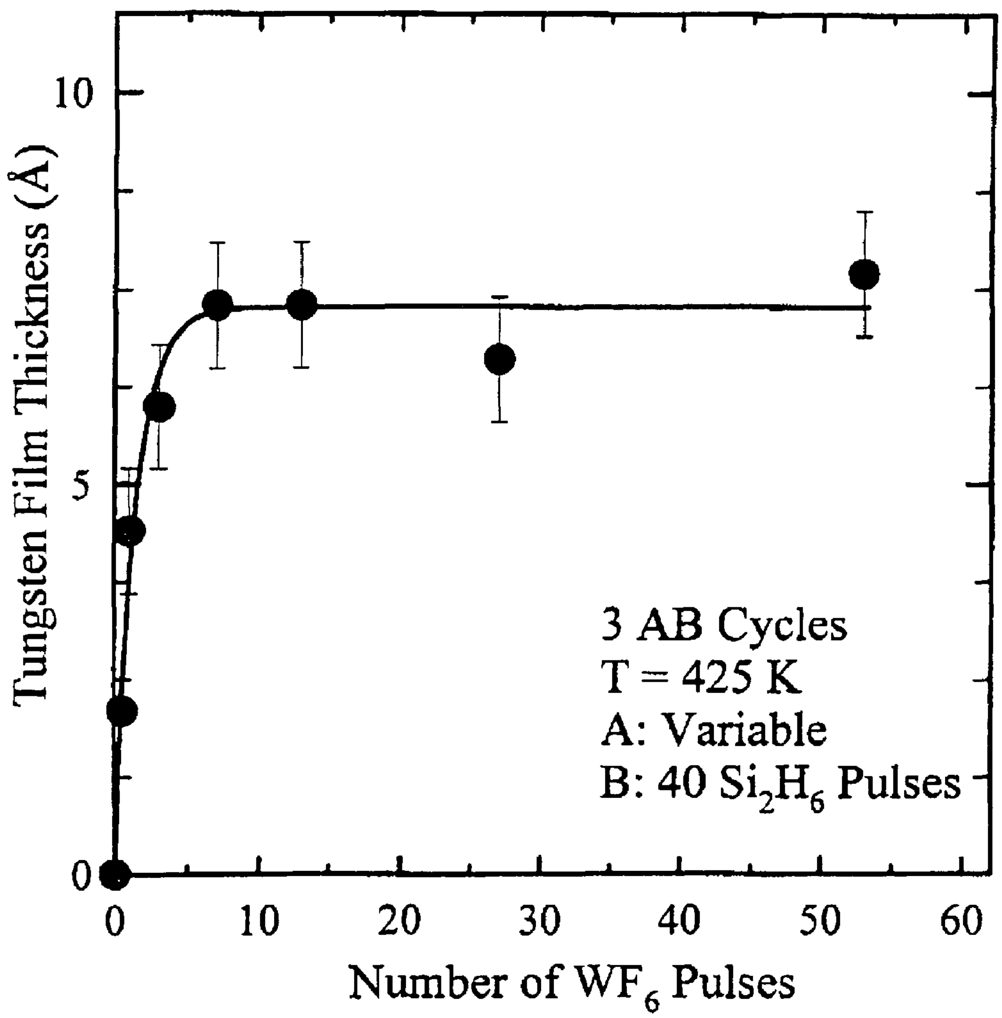
FIG. 8 is a graph of tungsten film thickness deposited after 3 AB cycles versus number of $WF_6$ pulses at 425 K. The $Si_2H_6$ exposure of 40 $Si_2H_6$ pulses during each AB cycle was sufficient for a complete $Si_2H_6$ half-reaction.
Figure 9:
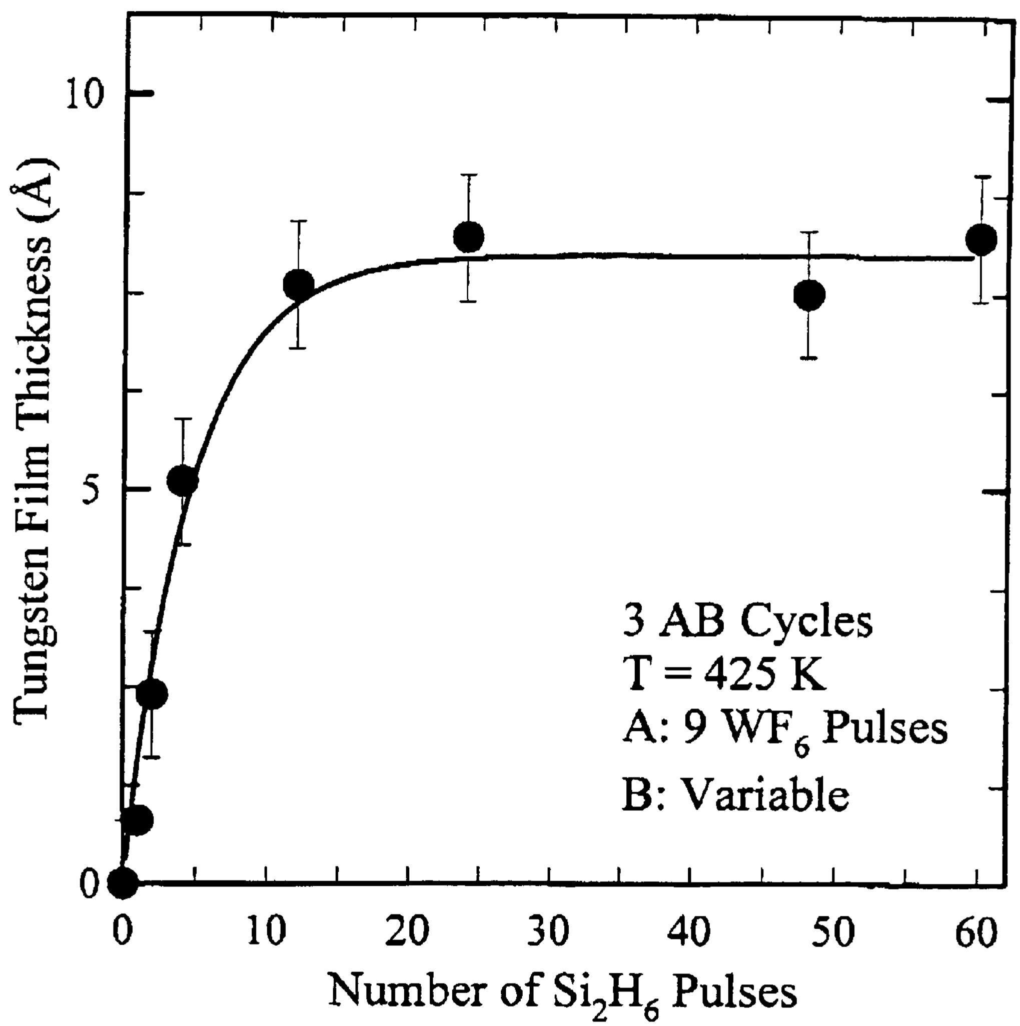
FIG. 9 shows a graph of tungsten film thickness deposited after 3 AB cycles versus number of $Si_2H_6$ pulses at 425 K. The $WF_6$ exposure of 9 $WF_6$ pulses during each AB cycle was sufficient for a complete $WF_6$ half-reaction.

The dependence of the tungsten growth rate on the $WF_6$ and $Si_2H_6$ reactant exposures can be examined by measuring the tungsten film thickness deposited on an underlying Si(100) substrate after 3 AB cycles at 425° K. The $WF_6$ and $Si_2H_6$ reactant exposures can be controlled by performing various numbers of identical reactant pulses. FIGS. 8 and 9 display ellipsometry results that demonstrate the self-limiting nature of the $WF_6$ and $Si_2H_6$ half-reactions at 425° K. The corresponding $Si_2H_6$ and $WF_6$ exposures during each AB cycle are generally sufficient for a complete half-reaction.

As shown in FIGS. 8 and 9, once a half-reaction reaches completion additional reactant exposure produces no additional film growth. Thus, unlike a CVD method, methods of the present invention allows control of the thickness of the metal film by controlling the total number of complete cycle of the self-limiting half-reactions. Typically, it has been found that under the conditions described in the Experimental section, the $WF_6$ and $Si_2H_6$ half-reactions reach completion after approximately 5 $WF_6$ reactant pulses and 20 $Si_2H_6$ reactant pulses, respectively. It is believed that these exposures correspond to absolute exposures of about 750 L for $WF_6$ and about 2700 L for $Si_2H_6$.

Figure 10:
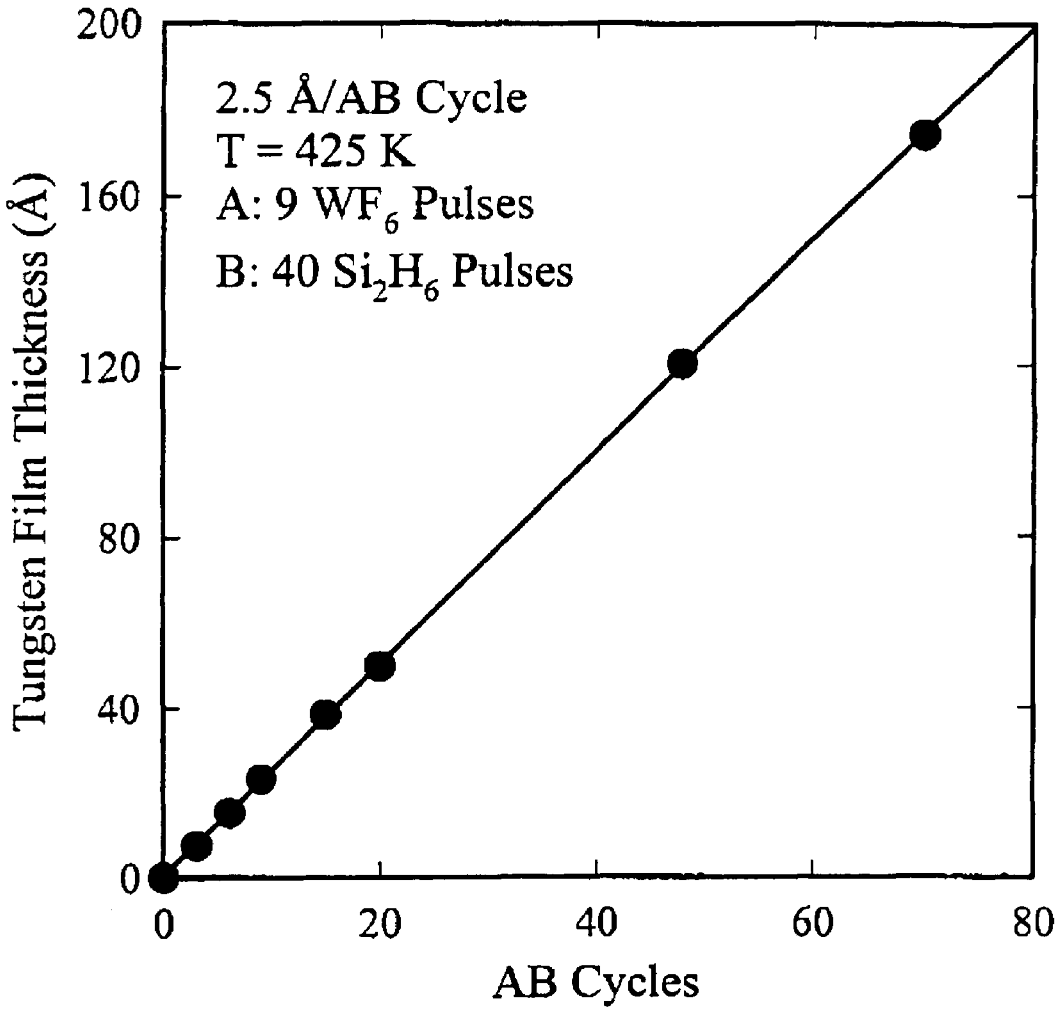
FIG. 10 shows a graph of tungsten film thickness deposited at 425 K versus number of AB cycles. The $WF_6$ and $Si_2H_6$ reactant exposures of 9 pulses and 40 pulses, respectively, were sufficient for complete half-reactions. The least squares linear fit to the data yields a tungsten growth rate of 2.5 Å/AB cycle.

$WF_6$ and $Si_2H_6$ reactant exposures of 9 reactant pulses and 40 reactant pulses, respectively, are more than sufficient for complete half-reactions. The ellipsometric measurements of the tungsten film thickness versus number of AB cycles at 425°K, as shown in FIG. 10, indicates the tungsten film thickness is proportional to the number of AB cycles and the growth rate of tungsten film is about 2.5 Å/AB cycle. The linear growth rate indicates that the number of reactive surface sites remains substantially constant during the deposition. The constant growth rate also shows that the tungsten film is growing uniformly with no surface roughening.

The measured tungsten growth rate of 2.5 Å per AB cycle agrees with the expected thickness of a tungsten monolayer. The density of tungsten is $\rho$=19.3 g/cm$^3$ or $\rho$=6.32×10$^{22}$ atoms/cm$^3$. Based on this density and assuming a simple cubic packing of tungsten atoms, the predicted thickness of a tungsten monolayer is $\rho^{-1/3}$=2.51 Å. Likewise, the predicted coverage of tungsten atoms in one monolayer is $\rho^{2/3}$ =1.59×10$^{15}$ atoms/cm$^2$.

The ellipsometric measurements also yield the refractive index (ñ=n+ik) for the tungsten films. This refractive index varies with film thickness. A refractive index of n= 2.4±0.6 and k=0.8±0.3 was measured at a film thickness of 45 Å. The refractive index increases to n=3.66±0.41 and k=2.95±0.22 at film thicknesses of about 300 Å or higher. The measured optical constants for the thicker tungsten films compare well with literature values of n=3.6 and k=2.9 [33].

Figure 11:
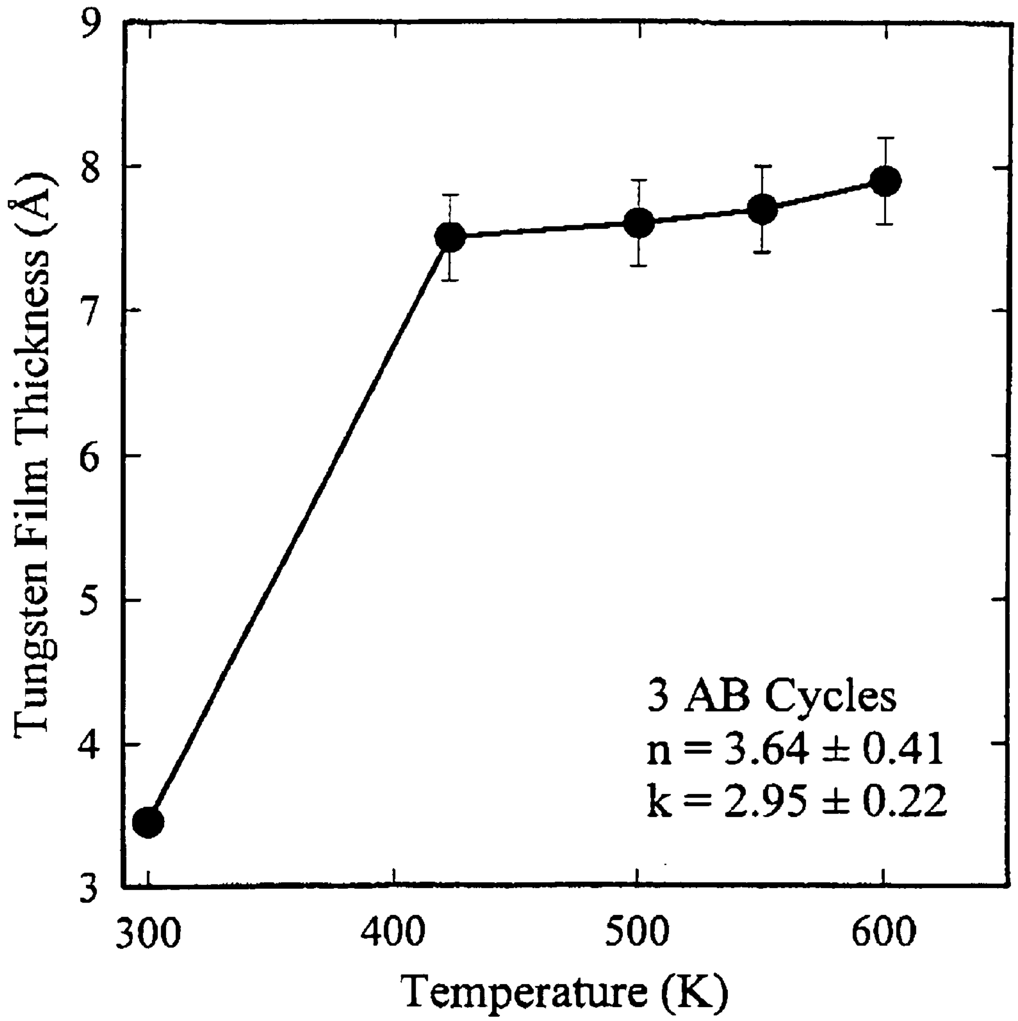
FIG. 11 shows a graph of tungsten film thickness deposited after 3 AB cycles versus substrate temperature. The $WF_6$ and $Si_2H_6$ reactant exposures at each temperature were sufficient for complete half-reactions.

The ellipsometric measurements of the tungsten film thickness deposited by 3 AB reaction cycles versus substrate temperature are shown in FIG. 11. The $WF_6$ and $Si_2H_6$ reactant exposures at each temperature are sufficient for complete half-reactions. FIG. 11 shows that the tungsten film thickness deposited by 3 AB cycles increases from 300 to 400° K. At 300° K, it is believed that the surface half-reactions rate is slow, and therefore, the reaction does not proceed to completion at a given exposure time, i.e., reaction time. Under such reaction time, a tungsten growth rate of 1.1 Å/AB cycle was measured at 300° K.

FIG. 11 shows that the tungsten deposition rate is constant at ~2.5 Å per AB cycle for substrate temperatures at about 425° K. or higher. These temperatures are sufficient for complete half-reactions according to the FTIR vibrational studies. It is believed that the constant tungsten deposition rate versus temperature is due to the high stability of the $^*WF_x$ and $^*SiH_yF_z$ species at about 425° K. to about 600° K. It is also believed that if the $^*WF_x$ and $^*SiH_yF$ coverages remain constant, the same number of tungsten atoms are deposited during each AB cycle.

Figure 12:
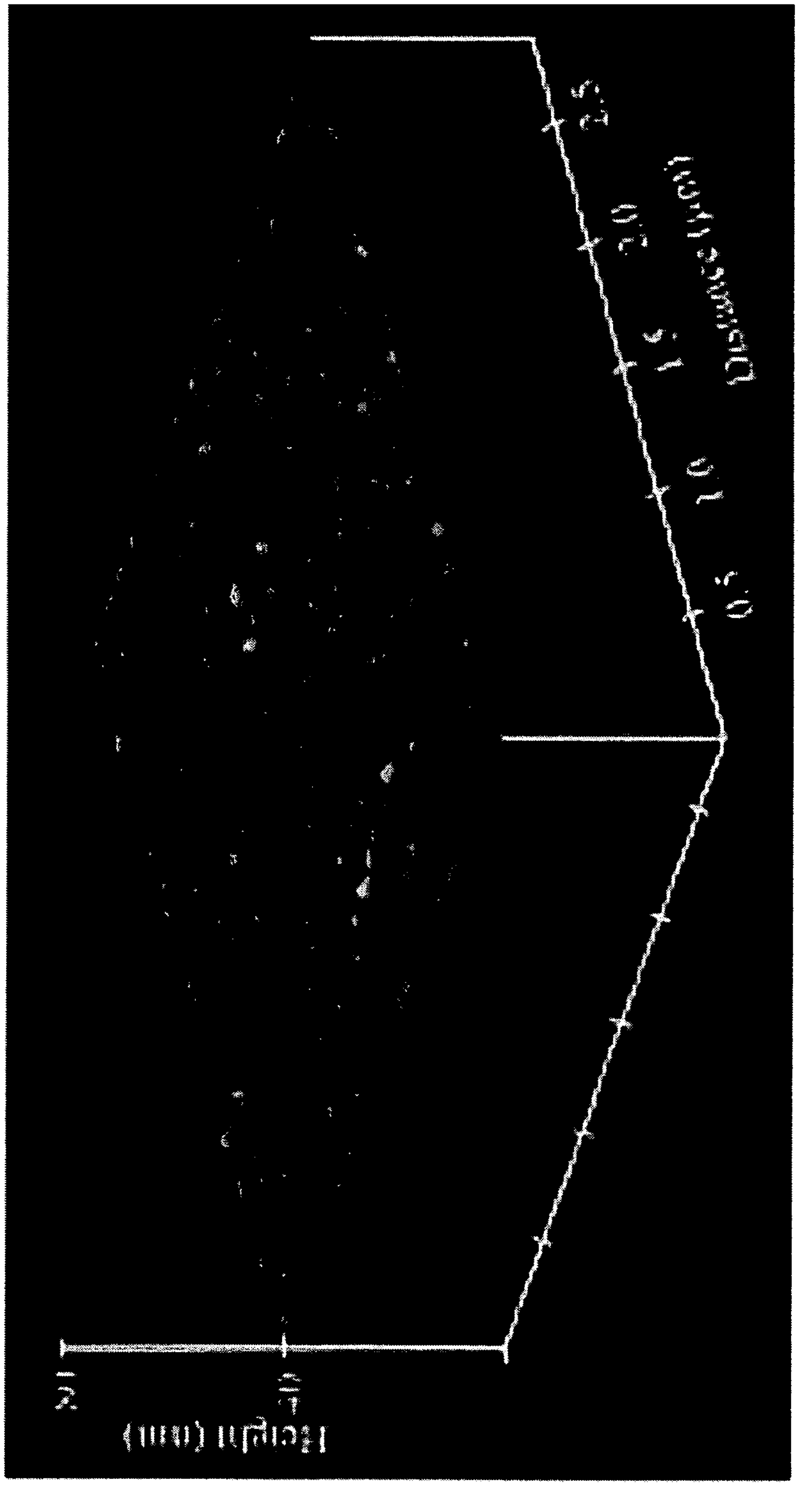
FIG. 12 is an atomic force microscope image of a ~320 Å thick tungsten film deposited at 425 K after 125 AB cycles. The $WF_6$ and $Si_2H_6$ reactant exposures were sufficient for complete half-reactions. The light-to-dark range is 25 Å.

The surface topography of the deposited tungsten films can be examined using a Nanoscope III atomic force microscope (AFM) from Digital Instruments operating in tapping mode. FIG. 12 shows an AFM image of about 320 Å thick tungsten film deposited by 125 AB cycles at 425° K. The AFM image shows that the tungsten film produced by methods of the present invention have surface morphology that is very smooth. The light-to-dark gray scale spans <25 Å and the tungsten films exhibit a surface root-mean-square (rms) roughness of +4.8 Å. In comparison, the roughness of the initial Si(100) substrate was +2.5 Å (rms). The power spectral density of the surface roughness also exhibited the similar statistical characteristics as the initial $SiO_2$ surface on Si(100) [7]. This smooth surface topography indicates that methods of the present invention allows the tungsten film to grow uniformly over the initial substrate with relatively negligible roughening. These results are in marked contrast with earlier attempts to deposit metallic copper films which were rough and displayed coarse polycrystalline grains [17,18].

The tungsten film composition can also be evaluated using x-ray photoelectron spectroscopy (XPS) depth-profiling [36]. After sputtering through the surface region, the elemental concentrations in the tungsten film are constant until encountering the $SiO_2$ layer on the Si(100) substrate. The tungsten films produced by methods of the present invention contained no measurable silicon or fluorine. These results show that $Si_2H_6$ reduces $WF_x$* species, i.e., removes fluorine from $WF_x$* species, and the resulting $SiH_yF_z$* species are subsequently removed by the next $WF_6$ exposure.

Glancing angle X-ray diffraction experiments [36] can be used to evaluate the crystallographic structure of the tungsten films. Using Cu $K_\alpha$ radiation incident at 4°, the tungsten films produced by methods of the present invention resulted in a very broad 2θ diffraction peak widths (FWHM) of about 5°. Without being bound by any theory, it is believed that these broad diffraction peaks indicate that the tungsten films are either amorphous [39] or are composed of very small crystalline grains. In addition, the adhesion of the tungsten films to the starting Si (100) substrate was examined using the "scratch and peel" tests [40]. The tungsten films survived these tests with no evidence of delamination.

The electrical resistivity of tungsten films with a thickness of about 320 Å was also measured using the four point probe technique with silver paint electrical contacts [41]. The electrical resistivity was determined to be 122 $\mu\Omega$ cm. In comparison, the resistivity is 5 $\mu\Omega$ cm for pure tungsten metal [42] and 16 $\mu\Omega$ cm for crystalline tungsten films grown using $WF_6$+$SiH_4$ chemical vapor deposition [39]. The higher resistivity of 122 $\mu\Omega$ cm is believed to be due to the amorphous structure of the tungsten film.

Additional objects, advantages, and novel features of this invention will become apparent to those skilled in the art upon examination of the following examples thereof, which are not intended to be limiting.

EXPERIMENTAL

Experimental 1

This experiment is directed to FTIR Spectroscopy Studies of Silica Powder.

The FTIR spectroscopy experiments were performed in a high vacuum chamber built for in situ transmission FTIR spectroscopic investigations [27]. A schematic of this chamber is displayed in FIG. 1. The chamber was equipped with a 200 L/s turbomolecular pump, CsI windows, an ion gauge, a capacitance manometer, and a quadrupole mass spectrometer. The chamber had a base pressure of 5×10$^{-8}$ Torr. The vibrational spectra were recorded with a Nicolet 740 FTIR spectrometer using an MCT-B detector.

High surface area silica powder was used to achieve sufficient surface sensitivity for the FTIR investigations. High surface area fumed silica powder was obtained from Aldrich. This silica powder had a surface area of 380 m$^2$/g. The silica powder was pressed into an tungsten photoetched grid [28]. This tungsten grid from Buckbee-Mears was 0.002 inch thick and contained 100 lines per inch. The tungsten was then suspended between copper posts on the sample mount. This sample could be resistively heated to about 1000° K. A tungsten-rhenium thermocouple spot-welded to the grid provided accurate sample temperature measurement.

Figure 2:
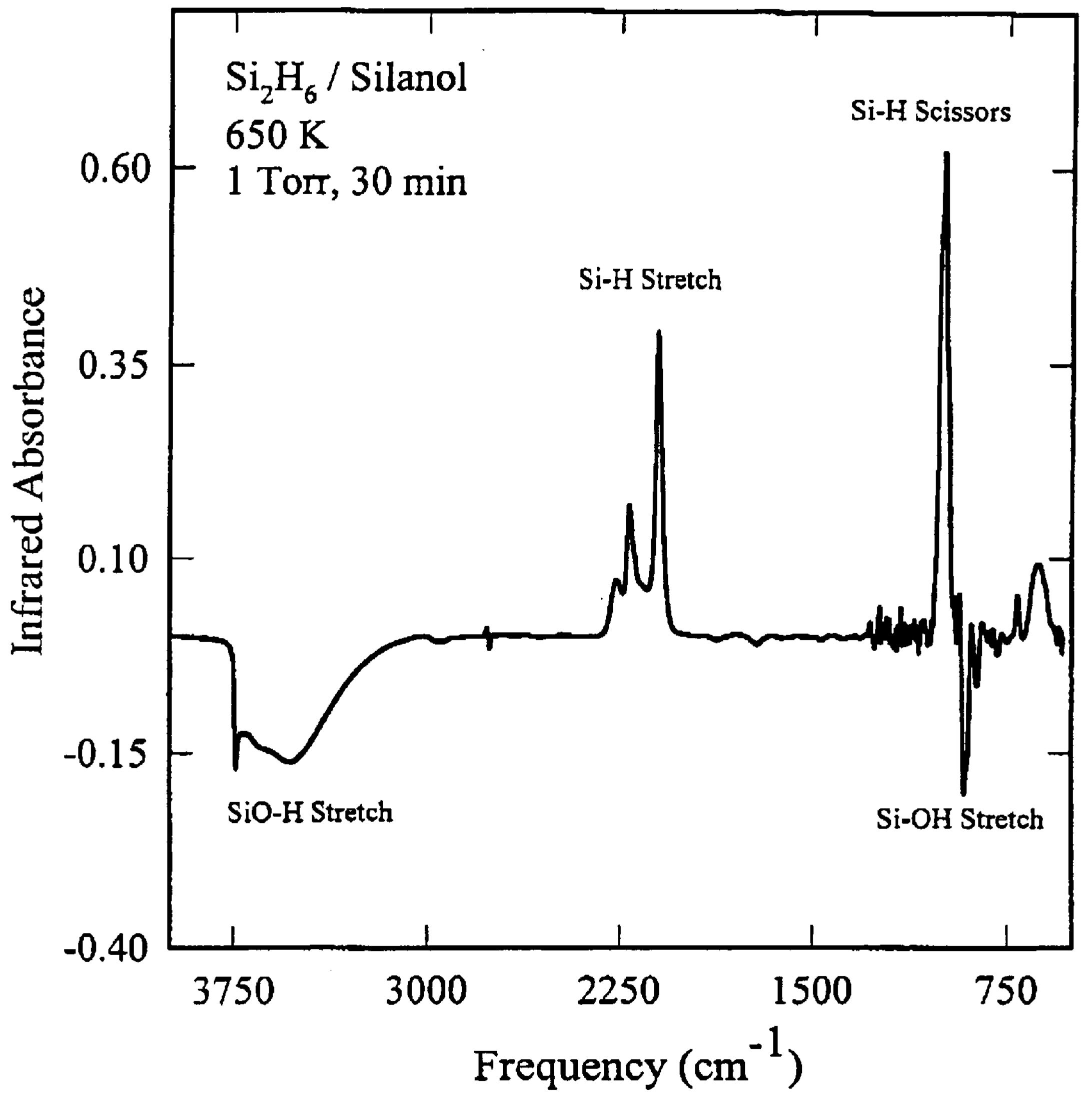
FIG. 2 is a FTIR difference spectra recorded after the reaction of $Si_2H_6$ with hydroxylated $SiO_2$ particles at 650 K. The negative absorbance features are consistent with removal of the SiOH* species. The positive absorbance features correspond to the deposition of SiH* species.

The FTIR spectrum of the silica powder recorded immediately after loading into vacuum exhibited a pronounced surface vibrational feature that extended from 3750 cm$^{-1}$ to 3000 cm$^{-1}$. This feature is attributed to SiOH* species [29]. To prepare the $SiO_2$ surface for tungsten film deposition, the hydroxylated $SiO_2$ (silanol) surface was first exposed to about 1 Torr of $Si_2H_6$ for 30 min at 650° K. FIG. 2 shows a FTIR difference spectrum recorded after this $Si_2H_6$ exposure.

The negative absorbance features in FIG. 2 are consistent with the $Si_2H_6$ reaction removing about 90% of the *SiOH species. The $Si_2H_6$ exposure also produced positive absorbance features that are assigned to Si—H stretching features at 2270, 2203 and 2100 $cm^{-1}$, as well as a Si—H scissors mode at 990 $cm^{-1}$ [24,25,30,31]. A few $WF_6$ and $Si_2H_6$ reaction cycles were subsequently performed to transform the $SiO_2$ surface to a tungsten surface. The $WF_6$ and $Si_2H_6$ sequential surface reactions were then examined on this tungsten film.

Additional FTIR difference spectra were utilized to measure the $*WF_x$ species and $*SiH_yF_z$ species during the $WF_6$ and $Si_2H_6$ half-reactions. The FTIR spectra were recorded at 340° K after various $WF_6$ or $Si_2H_6$ exposures at different temperatures. Gate valves protected the CsI windows during the reactant exposures. The $*WF_x$ surface species were monitored using the W—F stretching mode located at about 680 $cm^{-1}$ [24]. The surface silicon coverage was monitored using the Si—H stretch, Si—H scissors and Si—F stretch at about 2150, 910 and 830 $cm^{-1}$, respectively [24,25,30,31].

Experiment 2

This experiment is directed to Spectroscopic Ellipsometry Studies of Si(100).

Figure 3:
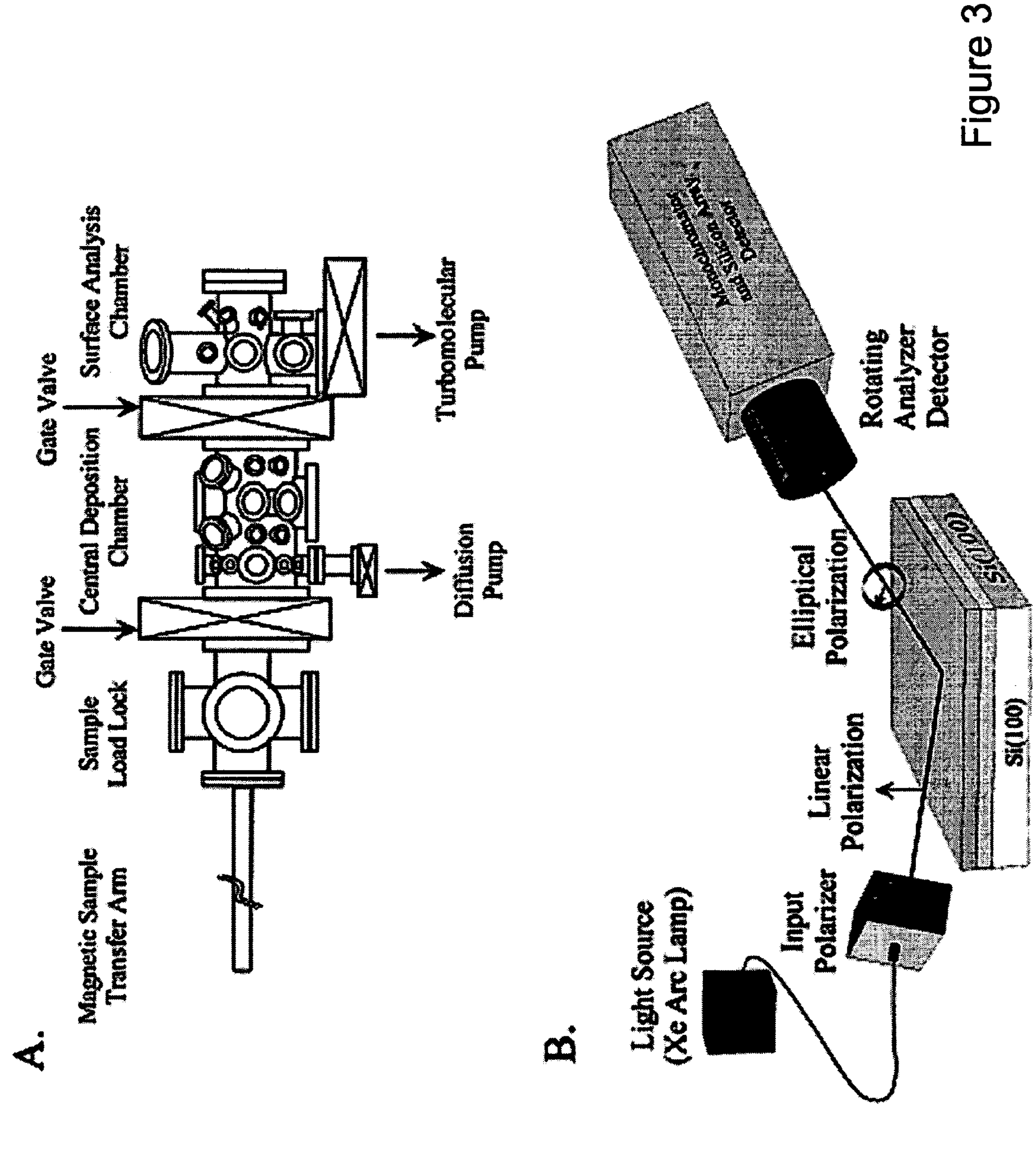
FIG. 3A is an experimental schematic of vacuum apparatus for in situ spectroscopic ellipsometry studies on Si(100) samples.
FIG. 3B is a spectroscopic ellipsometry conducted in the central deposition chamber using a rotating analyzer detector.

The tungsten film growth experiments were performed in a high vacuum apparatus designed for ellipsometric investigations of thin film growth [7]. A schematic of this apparatus is shown in FIG. 3. The apparatus consists of a sample load lock chamber, a central deposition chamber and a ultra high vacuum chamber for surface analysis. The central deposition chamber is capable of automated dosing of molecular precursors under a wide variety of conditions. The deposition chamber is pumped with either a 175 L/s diffusion pump backed by a liquid $N_2$ trap and a mechanical pump or two separate liquid $N_2$ traps backed by mechanical pumps. This chamber had a base pressure of $1\times10^{-7}$ Torr.

The central deposition chamber is equipped with an in situ spectroscopic ellipsometer (J. A. Woolam Co. M-44). This ellipsometer collects data at 44 visible wavelengths simultaneously. The ellipsometer is mounted on ports positioned at 80° with respect to the surface normal. Gate valves protect the birefringent-free ellipsometer windows from deposition during the $WF_6$ and $Si_2H_6$ exposures. The surface analysis chamber has a UTI-100C quadrupole mass spectrometer. This analysis chamber is pumped by a 210 l/s turbomolecular pump to obtain a base pressure of $1\times10^{-9}$ Torr. Mass spectometric analysis of the gases in the central deposition chamber can be performed using a controlled leak to the surface analysis chamber.

The sample substrate for the ellipsometer studies was a Si(100) wafer covered with 125 Å of $SiO_2$ formed by thermal oxidation. The Si(100) wafers were p-type boron-doped with a resistivity of p=0.01–0.03 Ω cm. Square pieces of the Si(100) wafer with dimensions of 0.75 in ×0.75 in were used as the samples. The highly-doped Si(100) samples were suspended between copper posts using 0.25 mm Mo foil and could be resistively heated to >1100 K. The sample temperature was determined by a Chromel-Alumel thermocouple pressed onto the $SiO_2$ surface using a spring clip.

The Si(100) samples were cleaned with methanol, acetone and distilled water before mounting and loading into the chamber. The $SiO_2$ surface was further cleaned in vacuum by an anneal at 900° K for 5 minutes. This thermal anneal was followed by a high frequency $H_2O$ plasma discharge at 300°K. This $H_2O$ plasma fully hydroxylated the $SiO_2$ surface and removed surface carbon contamination.

To initiate the tungsten film growth, the hydroxylated $SiO_2$ surface was first exposed to 10 mTorr of $Si_2H_6$ at 600° K for about 5 mins. FTIR spectroscopy indicates that $Si_2H_6$ reacts with the surface hydroxyl groups and deposits surface species containing Si—H stretching vibrations: e.g. $*SiOH+Si_2H_6$-+$*SiOSiH_3+SiH_4$. After the initial $Si_2H_6$ treatment, tungsten film growth could be performed at reaction temperatures between about 425° K to about 600° K. A few $WF_6$ and $Si_2H_6$ reaction cycles were utilized to transform the $SiO_2$ surface to a tungsten surface. The dependence of the tungsten growth rate on $WF_6$ and $Si_2H_6$ reactant exposure was examined on this tungsten surface.

The $WF_6$ and $Si_2H_6$ exposures were controlled by performing various numbers of identical reactant pulses. The $WF_6$ or $Si_2H_6$ reactants were introduced by opening automated valves for a few milliseconds. These valve openings create small pressure transients in the deposition chamber. The total exposure of either the $WF_6$ or $Si_2H_6$ reactant during one AB cycle was defined in terms of the number of identical reactant pulses. Between the $WF_6$ and $Si_2H_6$ reactant exposures, the deposition chamber was purged with $N_2$ for several minutes. The pressure transients were recorded with a baratron pressure transducer. The absolute reactant exposures were estimated from the pressure versus time waveform.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

REFERENCES

1. The National Technology Roadmap for Semiconductors, SIA Semiconductor Industry Association 4300 Stevens Creek Boulevard, San Jose, Calif. 95129, USA (http://www.sematech.org/public/roadmap/index.htm), 1997.
2. K.-M. Chang, T.-H. Yeh, I.-C. Deng, C.-W. Shih, J. Appl. Phys. 82 (1997) 1469.
3. W.-K. Yeh, M.-C. Chen, P.-J. Wang, L.-M. Liu, M.-S. Lin, Thin Solid Films 270 (1995) 462.
4. Z. H. Lu, D. J. Lockwood, J. M. Baribeau, Nature 378 (1995) 258.
5. S. M. George, A. W. Ott, J. W. Klaus, J. Phys. Chem. 100 (1996) 13121.
6. T. Suntola, Thin Solid Films 216 (1992) 84.
7. A. W. Ott, J. W. Klaus, J. M. Johnson, S. M. George, Thin Solid Films 292 (1996) 135.
8. H. Kumagai, M. Matsumoto, M. Obara, M. Suzuki, Thin Solid Films 263 (1995) 47.
9. H. Kumagai, K. Toyoda, K. Kobayashi, M. Obara, Y. Iimura, Appl. Phys. Lett. 70 (1997) 2338.
10. J. W. Klaus, A. W. Ott, J. M. Johnson, S. M. George, Appl. Phys. Lett. 70 (1997) 1092.
11. M. Ritala, M. Leskela, Thin Solid Films 225 (1993) 288.
12. S. Morishita, S. Sugahara, M. Matsumura, Appl. Surf. Sci. 112 (1997) 198.

13. J. W. Klaus, A. W. Ott, A. C. Dillon, S. M. George, Surf. Sci. 418 (1998) L14.

14. M. Han, Y. Luo, J. E. Moryl, J. G. Chen, R. M. Osgood, Surf. Sci. 415 (1998) 251.

15. M. Ritala, H. Saloniemi, M. Leskela, T. Prohaska, G. Friedbacher, M. Grasserbauer, Thin Solid Films 286 (1996) 54.

16. M. Ishii, S. Iwai, H. Kawata, T. Ueki, Y. Aoyagi, J. Cryst. Growth 180 (1997) 15.

17. M. Juppo, M. Ritala, M. Leskela, J. Vac. Sci. Technol. 15 (1997) 2330.

18. P. Martensson, J. Carlsson, Chem. Vap. Deposition 22 (1997) 333.

19. S. M. Gates, D. D. Koleske, J. R. Heath, M. Copel, Appl. Phys. Lett. 62 (1993) 510.

20. Y. Takahashi, H. Ishii, K. Fujinaga, J. Electrochem. Soc. 136 (1989) 1826.

21. P. J. Ireland, Thin Solid Films 304 (1997) 1.

22. T. Kodas, M. Hampden-Smith, The Chemistry of Metal CVD; VCH: New York, 1994.

23. D. A. Bell, C. M. McConica, K. L. Baker, E. Kuchta, J. Electrochem. Soc. 143 (1996) 296.

24. N. Kobayashi, Y. Nakamura, H. Goto, Y. Homma, J. Appl. Phys. 73 (1993) 4637.

25. N. Kobayashi, H. Goto, M. Suzuki, J. Appl. Phys. 69 (1991) 1013.

26. Y. Yamamoto, T. Matsuura, J. Murota, Surf. Sci. 408 (1998) 190.

27. A. C. Dillon, M. B. Robinson, M. Y. Han, S. M. George, J. Electrochem. Soc. 139 (1992) 537.

28. P. Basu, T. H. Ballinger, J. T. Yates Jr., Rev. Sci. Instrum. 59 (1988) 1321.

29. O. Sneh, M. L. Wise, A. W. Ott, L. A. Okada, S. M. George, Surf. Sci. 334 (1995) 135.

30. P. Gupta, V. L. Colvin, S. M. George, Phys. Rev. 37 (1988) 8234.

31. Y. J. Chabal, K. Raghavachari, Phys. Rev. Lett. 54 (1985) 1055.

32. K. Nakamoto, *Infrared Spectra of Inorganic and Coordination Compounds*; Wiley-Interscience: New York, 1970.

33. E. Palik, *Handbook of Optical Constants of Solids; Academic Press*: Orlando, 1985; Vol. 1.

34. A. W. Ott, K. C. McCarley, J. W. Klaus, J. D. Way, S. M. George, Appl. Surf. Sci. 107 (1996) 128.

35. O. Sneh, S. M. George, J. Phys. Chem. 99 (1994) 4639.

36. These experiments were performed by Eli Mateeva in the Department of Metallurgical and Materials Engineering at the Colorado School of Mines.

37. E. Umbach, D. Menzel, Surf. Sci. 135 (1983) 199.

38. S. Ingrey, M. Johnson, R. Streater, G. Sproule, J. Vac. Sci. Technol. 20 (1982) 968.

39. K. M. Chang, I. C. Deng, H. Y. Lin, J. Electrochem. Soc. 146 (1999) 3092,

40. B. N. Chapman, J. Vac. Sci. Technol. 11 (1974) 106.

41. A. Uhlir, Bell. Sys. Tech. 35 (1956) 333.

42. *American Institute of Physics Handbook*, D. E. Gray, Coordinating Editor, Third Edition (McGraw-Hill Book Company, New York, 1982)

What is claimed is:

1. A method for producing a solid material comprising a thin film of metal on a solid substrate surface, said method comprising:

(a) contacting said solid substrate surface with a metal halide gas, wherein the metal is selected from the group consisting of tungsten, rhenium, molybdenum, antimony, selenium, thallium, chromium, platinum, ruthenium, iridium, and germanium, under conditions including a temperature from 425 to 600 K sufficient to deposit a layer of said metal halide on said solid substrate surface;

(b) thereafter contacting said surface with a reducing agent consisting of a gaseous silylating agent under conditions including a temperature from 425 to 600 K, such that the silylating agent reacts with metal halide species on said solid substrate surface to form silane moieties at the surface of the substrate;

(c) then contacting said surface with additional metal halide gas under conditions including a temperature from 425 to 600 K such that the additional metal halide gas reacts with the silane moieties formed at the surface of the substrate in step (b) to form a metal film layer having metal halide surface species;

and thereafter sequentially repeating steps (b) and (c) one or more additional times, whereby in each cycle of steps (b) and (c), the metal halide and silylating agent react to produce a metal film layer having a thickness substantially corresponding to the atomic spacing of said metal.

2. The method of claim 1, wherein said solid substrate surface comprises a group selected from oxides, nitrates, metals, semiconductors, polymers with a functional group, and mixtures thereof.

3. The method of claim 1, wherein said metal halide is tungsten fluoride.

4. The method of claim 1, wherein the silylating agent comprises silane, disilane, trisilane and mixtures thereof.

5. The method of claim 1, wherein said thin metal film surface comprises metal—metal halide surface.

6. The method of claim 1 further comprising repeating said steps (b) and (c) to obtain a desired thickness of said metal film.

7. The method of claim 1 further comprising contacting said solid surface with the silylating agent prior to said step (a).

8. The method of claim 7, wherein said solid substrate surface comprises a hydroxide.

9. A method for producing a solid material comprising a thin film of metal on a solid substrate surface, said method comprising:

(a) contacting said solid substrate surface with a metal fluoride gas, wherein the metal is selected from the group consisting of tungsten, rhenium, molybdenum, antimony, selenium, thallium, chromium, platinum, ruthenium, iridium, and germanium, under conditions including a temperature from 425 to 600 K sufficient to deposit a layer of said metal fluoride on said solid substrate surface;

(b) thereafter contacting said surface with a reducing agent consisting of a gaseous silylating agent under conditions including a temperature from 425 to 600 K, such that the silylating agent reacts with metal fluoride species on said solid substrate surface to form silane moieties at the surface of the solid substrate;

(c) then contacting said surface with additional metal fluoride gas under conditions including a temperature from 425 to 600 K such that the additional metal fluoride gas reacts with the silane moieties formed at the surface of the substrate in step (b) to form a metal layer having metal fluoride surface species;

and thereafter sequentially repeating steps (b) and (c) one or more additional times, whereby in each cycle of steps (b) and (c), the metal fluoride and silylating agent react to produce a metal film layer having a thickness substantially corresponding to the atomic spacing of said metal.

10. The method of claim 9, wherein said thin metal film surface comprises metal—metal halide surface.

11. The method of claim 9 further comprising repeating said steps (b) and (c) to obtain a desired thickness of said metal film.

12. The method of claim 9, wherein said solid substrate surface comprises a group selected from oxides, nitrates, metals, semiconductors, polymers with a functional group, and mixtures thereof.

13. The method of claim 9 further comprising contacting said solid substrate surface with the silylating agent prior to said step (a).

14. The method of claim 13, wherein said solid substrate surface comprises a hydroxide.

* * * * *